United States Patent
Imada

(10) Patent No.: US 11,402,691 B2
(45) Date of Patent: Aug. 2, 2022

(54) LIGHT SOURCE AND LIGHT PLATE FOR LIGHT EMITTING MODULE

(71) Applicant: NICHIA CORPORATION, Anan (JP)

(72) Inventor: Mamoru Imada, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/302,459

(22) Filed: May 3, 2021

(65) Prior Publication Data
US 2021/0255508 A1    Aug. 19, 2021

Related U.S. Application Data

(63) Continuation of application No. 16/911,922, filed on Jun. 25, 2020, now Pat. No. 11,036,083.

(30) Foreign Application Priority Data

Jun. 27, 2019   (JP) .............................. JP2019-120060
Mar. 31, 2020   (JP) .............................. JP2020-064515

(51) Int. Cl.
*H01L 33/50*      (2010.01)
*G02F 1/13357*   (2006.01)
*G02F 1/1335*     (2006.01)

(52) U.S. Cl.
CPC .. *G02F 1/133606* (2013.01); *G02F 1/133603* (2013.01); *H01L 33/502* (2013.01); *H01L 33/505* (2013.01); *G02F 1/133607* (2021.01); *G02F 1/133614* (2021.01)

(58) Field of Classification Search
CPC ......... G02F 1/133606; G02F 1/133603; H01L 33/502; H01L 33/505
See application file for complete search history.

(56) References Cited

U.S. PATENT DOCUMENTS

2005/0265029 A1   12/2005   Epstein et al.
2006/0002146 A1   1/2006   Baba
2007/0121340 A1   5/2007   Hoshi
(Continued)

FOREIGN PATENT DOCUMENTS

EP     2420723 A1    2/2012
EP     3579273 A1    12/2019
(Continued)

OTHER PUBLICATIONS

Notice of Allowance, United States Patent and Trademark Office, issued to U.S. Appl. No. 16/911,922, dated Feb. 4, 2021, 8 pages.

*Primary Examiner* — Joseph L Williams
(74) *Attorney, Agent, or Firm* — Hunton Andrews Kurth LLP

(57) ABSTRACT

A light emitting module comprising a light guide plate and a light source. The light guide plate has a polygonal shape with a plurality of corners in a plan view. The light guide plate has a first primary face which serves as an emission face, a second primary face opposing the first primary face, and a recessed portion in the second primary face. The light source is disposed in the recessed portion. The recessed portion has an opening on the second primary face, and a bottom face having a polygonal shape in a plan view. The light source has lateral faces along sides of the bottom face of the recessed portion. In a plan view, diagonal lines connecting opposing corners of the first primary face intersect with the sides of the bottom face of the recessed portion.

20 Claims, 6 Drawing Sheets

(56) References Cited

U.S. PATENT DOCUMENTS

| | | |
|---|---|---|
| 2009/0086508 A1 | 4/2009 | Bierhuizen |
| 2010/0220484 A1 | 9/2010 | Shani et al. |
| 2011/0037740 A1 | 2/2011 | Yamaguchi |
| 2011/0305003 A1 | 12/2011 | Lee et al. |
| 2012/0032202 A1 | 2/2012 | Ogata et al. |
| 2012/0140464 A1 | 6/2012 | Huang et al. |
| 2014/0063801 A1 | 3/2014 | Seki et al. |
| 2018/0239193 A1 | 8/2018 | Hayashi |
| 2019/0049649 A1 | 2/2019 | Hayashi et al. |
| 2019/0227382 A1 | 7/2019 | Watanabe et al. |
| 2019/0249004 A1 | 8/2019 | Hirschsohn et al. |
| 2019/0371985 A1 | 12/2019 | Imada |
| 2020/0049876 A1 | 2/2020 | Watanabe et al. |
| 2020/0409220 A1 | 12/2020 | Imada |

FOREIGN PATENT DOCUMENTS

| | | |
|---|---|---|
| JP | 2007149451 A | 6/2007 |
| JP | 2010212083 A | 9/2010 |
| JP | 2011039122 A | 2/2011 |
| JP | 2012003263 A | 1/2012 |
| JP | 2018097974 A | 6/2018 |
| JP | 2018106826 A | 7/2018 |
| JP | 2018133304 A | 8/2018 |
| JP | 2019012681 A | 1/2019 |
| JP | 2019175846 A | 10/2019 |
| KR | 20090117419 | 11/2009 |
| WO | 2010070885 A1 | 6/2010 |
| WO | 2012132872 A1 | 10/2012 |

LIGHT SOURCE AND LIGHT PLATE FOR LIGHT EMITTING MODULE

CROSS-REFERENCE TO RELATED APPLICATION

This is a continuation application of U.S. patent application Ser. No. 16/911,922, filed Jun. 25, 2020, patented Jun. 15, 2021 as U.S. Pat. No. 11,036,083, which claims priority to Japanese Patent Application No. 2019-120060 filed on Jun. 27, 2019, and Japanese Patent Application No. 2020-064515 filed on Mar. 31, 2020, the disclosures of which are hereby incorporated by reference in their entireties.

BACKGROUND

The present disclosure relates to a light emitting module.

Light emitting modules employing light emitting elements such as light emitting diodes are widely utilized as planar light sources, for example, backlights for liquid crystal displays. For example, in direct-lit liquid crystal displays in which planar light sources are installed on the rear surfaces of the liquid crystal panels, there is an increasing demand for thinner planar light sources. In a configuration in which the distance between the light source and the emission face of a light guide plate is short as the planar light source becomes thinner, light is not fully diffused which tends to cause luminance non-uniformity and color non-uniformity to occur in the emission face. See, for example, Japanese Patent Publication No. 2018-133304.

SUMMARY

One of the objects of the present disclosure is to provide a light emitting module in which luminance non-uniformity and color non-uniformity in the emission face of the light guide plate may be reduced.

A light emitting module according to certain embodiment of the present disclosure includes a light guide plate and a light source. The light guide plate has a polygonal shape with a plurality of corners in a plan view. The light guide plate has a first primary face which serves as an emission face, a second primary face opposing the first primary face, and a recessed portion in the second primary face. The light source is disposed in the recessed portion. The recessed portion defines an opening on the second primary face, and a bottom face having a polygonal shape in a plan view. The light source has lateral faces along sides of the bottom face of the recessed portion. In a plan view, diagonal lines connecting opposing corners of the first primary face intersect with the sides of the bottom face of the recessed portion.

In accordance with the present disclosure, a light emitting module in which luminance non-uniformity and color non-uniformity in the emission face of the light guide plate may be reduced.

DESCRIPTION

Figure 1:
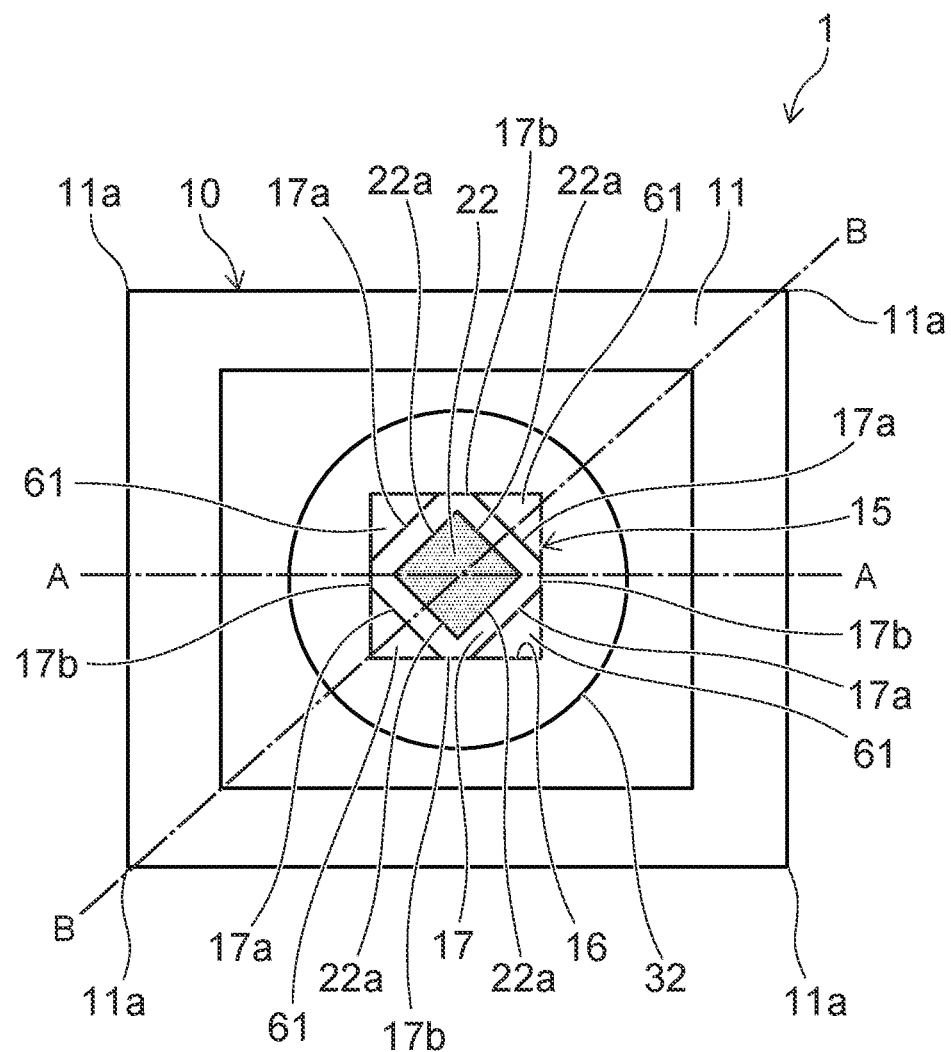
FIG. 1 is a schematic top view of a light emitting module according to an embodiment of the present disclosure.

Certain embodiments of the present disclosure will be explained below with reference to the accompanying drawings. In the drawings, the same elements are denoted with the same reference numerals.

Figure 2:
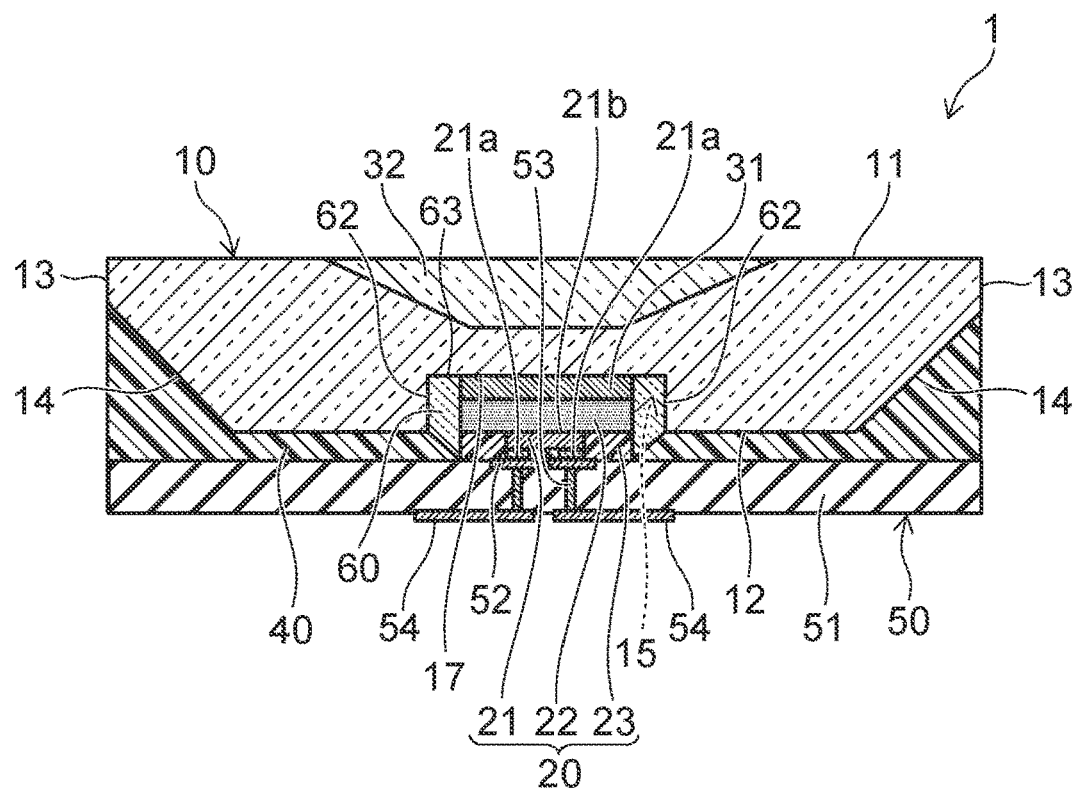
FIG. 2 is a sectional view taken along line A-A in FIG. 1.

FIG. 1 is a schematic top view of a light emitting module 1 according to an embodiment of the present disclosure. FIG. 2 is a sectional view taken along line A-A in FIG. 1.

The light emitting module 1 includes a light guide plate 10 and a light source 20. The light source 20 may include a light emitting element 21, a phosphor layer 22, and a cover member 23.

The light guide plate 10 transmits the light emitted by the light source 20. Examples of materials for the light guide plate 10 include a thermoplastic resin such as acrylic, polycarbonate, cyclic polyolefin, polyethylene terephthalate, and polyester, a thermosetting resin such as epoxy and silicone, and glass. Among these examples, polycarbonate is preferable due to its highly light transmissivity and inexpensiveness.

The light guide plate 10 has a first primary face 11, which serves as the emission face, a second primary face 12 opposing the first primary face 11, and a recessed portion 15 created in the second primary face 12. Furthermore, the light guide plate 10 may have lateral faces 13 contiguous with the first primary face 11, and oblique faces 14 between the lateral faces 13 and the second primary face 12.

At least the phosphor layer 22 of the light source 20 may be disposed in the recessed portion 15 of the light guide plate 10. The light emitting element 21 may be disposed on the face of the phosphor layer 22 opposite the face that opposes the first primary face 11 of the light guide plate 10. The recessed portion 15 can function as a positioning part for the light source 20 relative to the light guide plate 10.

The light emitting element 21 has a primary emission face 21b and includes a pair of positive and negative electrodes 21a on the opposite side of the primary emission face 21b. The light emitting element 21 has a semiconductor stack structure. The semiconductor stack structure includes, for example, $In_xAl_yGa_{1-x-y}N$ ($0 \leq x$, $0 \leq y$, $x+y \leq 1$) and can emit blue light.

The primary emission face 21b of the light emitting element 21 may be adhered to the phosphor layer 22 using, for example, a light transmissive adhesive. In the example shown in FIG. 2 and FIG. 3, the lateral faces and the electrodes 21a of the light emitting element 21 are positioned outside of the recessed portion 15. Alternatively, the light emitting element 21 may be disposed in the recessed portion 15. A cover member 23 may be disposed on the lateral faces of the light emitting element 21. The cover member 23 may also be disposed between the electrodes 21a at the lower face of the light emitting element 21. The cover member 23 reflects the light emitted by the light emitting element 21 and the phosphor in the phosphor layer 22. It is made of, for example, a resin containing a white pigment or the like. Particularly, the cover member 23 is preferably formed of a silicone resin containing titanium oxide.

The phosphor layer 22 may be made of a base material and a phosphor dispersed in the base material. For example, an epoxy resin, silicone resin, glass, or the like may be used as the base material for the phosphor layer 22. From the light resistance and formability perspectives, a silicone resin is preferably used for the base material.

The phosphor is excited by the light emitted from the light emitting element 21, and emits light of a different wavelength from that of the light emitted by the light emitting element 21. Examples of usable phosphor include YAG phosphors, LAG phosphors, β-SiAlON phosphors, CASN phosphors, KSF-based phosphors, quantum dot phosphors, and the like. The phosphor layer 22 may contain one or more types of phosphors.

An optical function part 32 may be disposed on the first primary face 11 of the light guide plate 10. The optical function part 32 may be disposed in the position facing the recessed portion 15 formed in the second primary face 12. The optical axis of the light emitting element 21 and the optical axis of the optical function part 32 preferably coincide with one another. The optical function part 32 may have the shape of, for example, an inverted cone, inverted polygonal pyramid such as inverted quadrangular or hexagonal pyramid, inverted frustum, inverted pyramidal frustum, or the like.

The optical function part 32 may comprise or be a light transmissive resin, glass, or air layer having a lower refractive index than the refractive index of the light guide plate 10, and may function as a lens to diffuse light in the extension direction of the first surface of the light guide plate 10 by refracting the light at the interfaces between the light guide plate 10 and the optical function part 32. The light guide plate 10 may alternatively have a configuration in which a light reflecting material (e.g., a metal reflective film or a white resin) is disposed in the recess having oblique faces, for example.

The recessed portion 15 may have an opening on the second primary face 12, and may have a bottom face 17 located more closely to the first primary face 11 than the second primary face 12. A light scattering layer 31 containing a light scattering agent may be disposed on the bottom face 17 of the recessed portion 15. The light scattering layer 31 may be disposed between the bottom face 17 of the recessed portion 15 and the phosphor layer 22. The light scattering layer 31 may scatter and return downwards a portion of the light emitted straight up from the light emitting element 21. Accordingly, the area and its vicinity directly above the light source 20 in the first primary face 11 of the light guide plate 10, which is the emission face of the light emitting module 1, is less likely to be excessively brighter than the remaining area. The light scattering layer 31 may be omitted, in which case the phosphor layer 22 may be disposed directly on the bottom face 17 of the recessed portion 15.

A light transmitting part 60 may be disposed in the recessed portion 15 and surrounding the light source (specifically, surrounding the phosphor layer 22 and surrounding of the light scattering layer 31). The light transmitting part 60 may comprise or may be a light transmissive resin part which transmits the light emitted from the light source 20. The refractive index of the light transmitting resin part may be lower than the refractive index of the light guide plate 10. The second light transmitting part 60 may be a void or air layer.

The light guide plate 10 may have oblique faces 14 each forming an obtuse angle and contiguous with the second primary face 12. The oblique faces 14 and the second primary face 12 may be covered with a light reflecting resin part 40.

The light reflecting resin part 40 reflects the light emitted by the light source 20 and is formed of, for example, a resin containing a white pigment or the like. Particularly, the light reflecting resin part 40 is preferably a silicone resin containing titanium oxide.

The electrodes 21a of the light emitting element 21 are respectively connected to the wirings 52. The light reflecting resin part 40 may be an insulator and may cover the lateral faces of the electrodes 21a of the light emitting element 21.

The light reflecting resin part 40 may be joined to a wiring board 50. The wiring board 50 may have an insulating base 51, wirings 54 disposed on the rear surface of the base 51, and vias 53 penetrating the base 51. The vias 53 respectively connect the wirings 52 and the wirings 54, and the electrodes 21a of the light emitting element 21 are respectively electrically connected to the wirings 54 through the wirings 52 and the vias 53.

Examples of materials for the base 51 of the wiring board 50 include a resin and a ceramic material. Examples of materials for the wirings 52 and 54, and the vias 53 include copper.

In the description herein, a plan view refers to a plan view of the first primary face 11 of the light guide plate 10 as shown in FIG. 1. In such a plan view, the first primary face 11 has a polygonal shape with multiple corners 11a, for example, a quadrangular shape or a square shape with four corners 11a.

In a plan view, the bottom face 17 of the recessed portion 15 may also have a polygonal shape. For example, the bottom face 17 of the recessed portion 15 has four long sides 17a and four short sides 17b which are shorter than the long sides 17a. Furthermore, the bottom face 17 may have a corner between a long side 17a and a short side 17b.

In a plan view, the phosphor layer 22 may be polygonal. The phosphor layer 22 is, for example, quadrangular or square shaped in a plan view and has four lateral faces 22a. The four lateral faces 22a may be each along the long sides 17a of the bottom face 17 of the recessed portion 15. In a plan view, the corners of the phosphor layer 22 may be positioned to each face the short sides 17b of the bottom face 17 of the recessed portion 15.

In a plan view, the diagonal lines connecting opposing corners 11a of the first primary face 11 may intersect with the long sides 17a of the bottom face 17 of the recessed portion 15. Position of the phosphor layer 22 on the bottom face 17 of the recessed portion 15 may be determined such that the lateral faces 22a of the phosphor layer 22 are along the long sides 17a of the bottom face 17 of the recessed portion 15.

The light source 20 having a quadrangular or square shape in a plan view may be positioned so as to be rotated 45 degrees relative to the quadrangular or square-shaped first primary face 11 of the light guide plate 10, for example, to thereby allow the lateral faces 22a of the phosphor layer 22 also serving as the lateral surfaces of the light source 20 (specifically, the sides of the quadrangular or square-shaped phosphor layer 22) to intersect with the diagonal lines connecting opposing corners 11a of the first primary face 11 in a plan view. In a plan view, the corners of the light source 20 (specifically, the corners of the phosphor layer 22) may be not positioned on the diagonal lines connecting opposing corners 11a of the first primary face 11, and may be positioned so as not to oppose the corners 11a. In a plan view, the corners of the light source 20 (specifically, the corners of the phosphor layer 22) may be positioned in the regions segmented by the diagonal lines connecting opposing corners 11a of the first primary face 11.

In the phosphor layer 22, the lateral faces 22a have larger areas than the corners. Thus, the luminance of the light exiting from the lateral faces 22a of the phosphor layer 22 tends to be higher than the luminance of the light exiting in diagonal directions.

In the quadrangular or square-shaped first primary face 11 of the light guide plate 10, moreover, the distance between the central portion where the phosphor layer 22 is disposed and each corner 11a is larger than the distance between the central portion and each side. Thus, the light tends not to readily diffuse to the four corners of the first primary face 11.

In accordance with the embodiment of the present disclosure, positioning the phosphor layer 22 relative to the light guide plate 10 so as to allow the lateral faces 22 of the phosphor layer 22 to intersect with the diagonal lines connecting opposing corners 11a of the first primary face 11 and to face the corners 11a of the first primary face 11 can facilitate the diffusion of the light exiting from the phosphor layer 22 to the four corners of the first primary face 11 of the light guide plate 10. This may reduce luminance non-uniformity and color non-uniformity in the first primary face 11 which is the emission face of the light emitting module 1.

Figure 3:
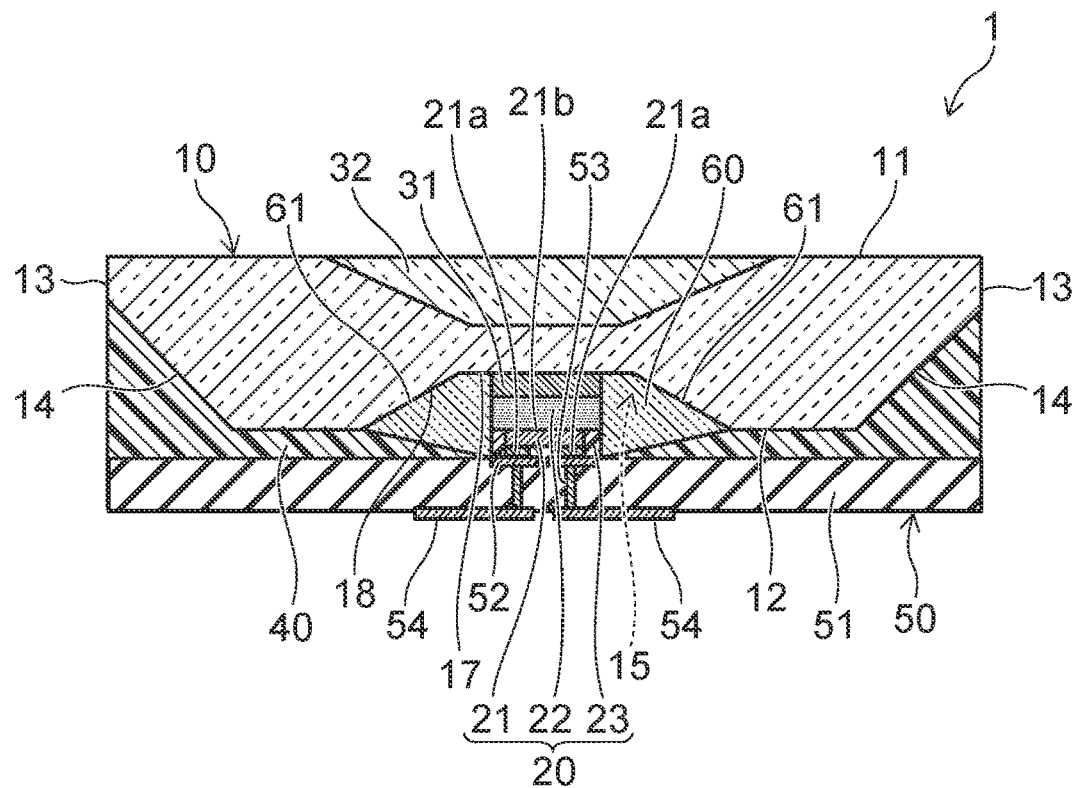
FIG. 3 is a sectional view taken along line B-B in FIG. 1.
Figure 4:
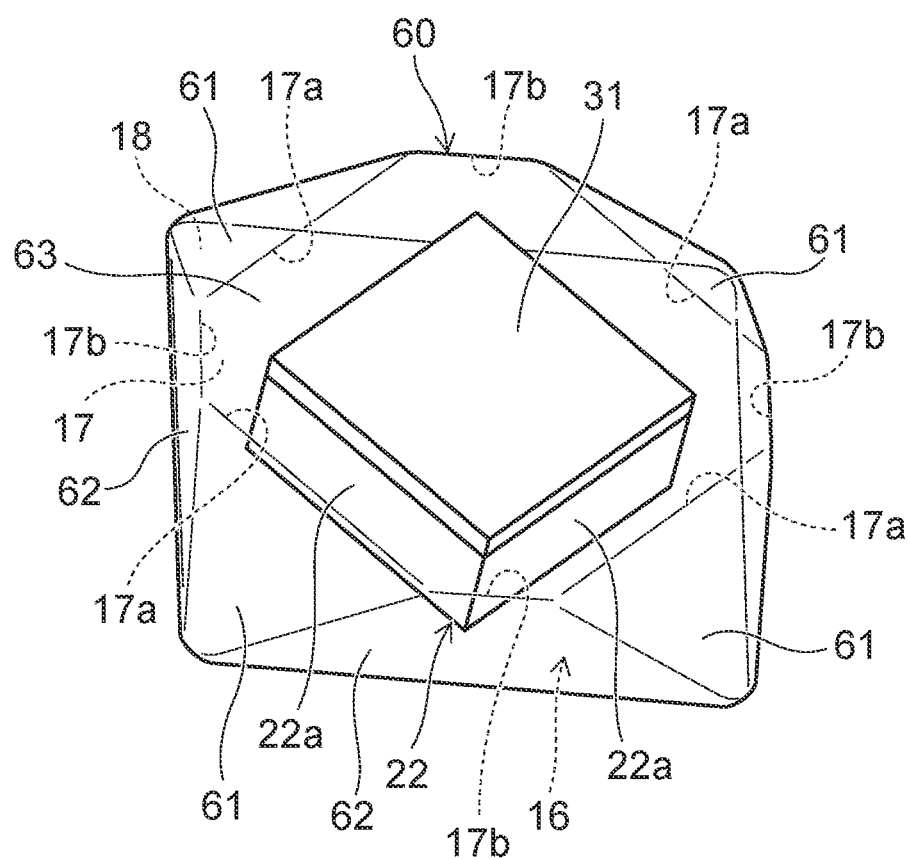
FIG. 4 is a perspective view of the elements in the recessed portion of the light guide plate in the light emitting module according to the embodiment.

FIG. 3 is a sectional view taken along line B-B in FIG. 1. FIG. 4 is a perspective view of the constituent elements (e.g., the light scattering layer 31, the phosphor layer 22, and the light transmitting part 60) in the recessed portion 15 of the light guide plate 10 in the light emitting module 1 according to the embodiment.

The shape of the opening 16 of the recessed portion 15 is, for example, a quadrangular or square, and the shape of the opening 16 of the recessed portion 15 may differ from the shape of the bottom face 17 of the recessed portion 15.

The recessed portion 15 may have oblique faces 18 each being oblique to, and forming an obtuse angle with, the bottom face 17 of the recessed portion 15. The light transmitting part 60 may be in contact with the oblique faces 18 of the recessed portion 15, and may have oblique faces 61 facing the oblique faces 18 of the recessed portion 15.

As shown in FIG. 2 and FIG. 4, the light transmitting part 60 has an upper face 63 in contact with the bottom face 17 of the recessed portion 15 and vertical faces 62 orthogonal to the bottom face 17 of the recessed portion 15. The vertical faces 62 may be also in contact with the light guide plate 10.

Forming the oblique faces 61 in the light transmitting part 60 can increase the area of contact with the light guide plate 10 as compared to the case in which only the upper face 63 and the vertical faces 62 are in contact with the light guide plate 10. In other words, this can increase the interfaces between the different materials, whereby the light exiting from the phosphor layer 22 through the light transmitting part 60 likely to enter into the light guide plate 10.

In the plan view in FIG. 1, the oblique faces 61 are positioned between the corners 11a of the first primary face 11 and the lateral faces 22a of the phosphor layer 22, while facing the corners 11a of the first primary face 11. Accordingly, the light from the phosphor layer 22 can be readily diffused to the four corners of the first primary face 11 of the light guide plate 10 through the oblique faces 61 of the light transmitting part 60, thereby reducing luminance non-uniformity and color non-uniformity in the first primary face 11.

Figure 5:
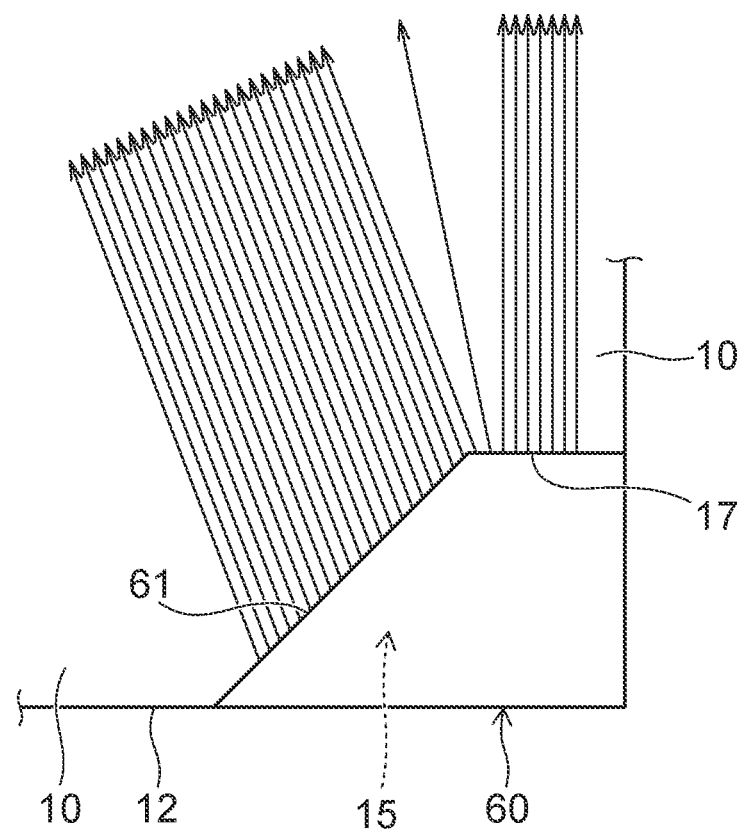
FIG. 5 is a schematic view of the interfaces between the light guide plate and the light transmitting part in the light emitting module according to the embodiment.

FIG. 5 is a schematic view of the interfaces between the light guide plate 10 and the light transmitting part 60.

The refractive index difference between the light transmitting part 60 and the light guide plate 10 by virtue of the oblique faces 61 of the light transmissive part 60 allows the light exiting from the light source 20 to readily advance in the directions of diffusion. Accordingly, the area and its vicinity directly above the light source 20 in the first primary face 11 of the light guide plate 10 is less likely to be excessively brighter than the remaining area, thereby reducing luminance non-uniformity and color non-uniformity. Even in the case where the light transmitting part 60 is configured as a void or air layer, the refractive index difference from that of the light guide plate 10 similarly allows the light exiting from the light source 20 to readily advance in the directions of diffusion.

Figure 6A:
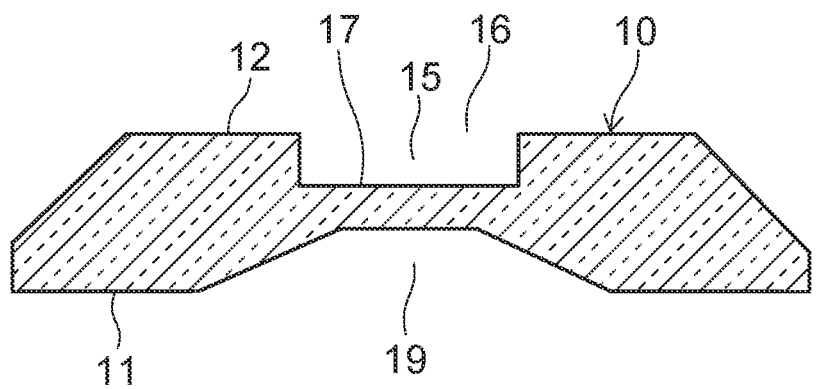
FIG. 6A is a schematic sectional view showing a method of manufacturing a light emitting module according to the embodiment.
Figure 6B:
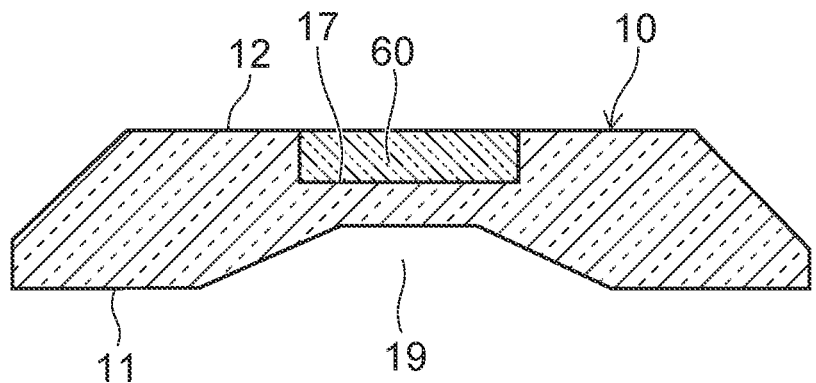
FIG. 6B is a schematic sectional view showing a method of manufacturing a light emitting module according to the embodiment.
Figure 6C:
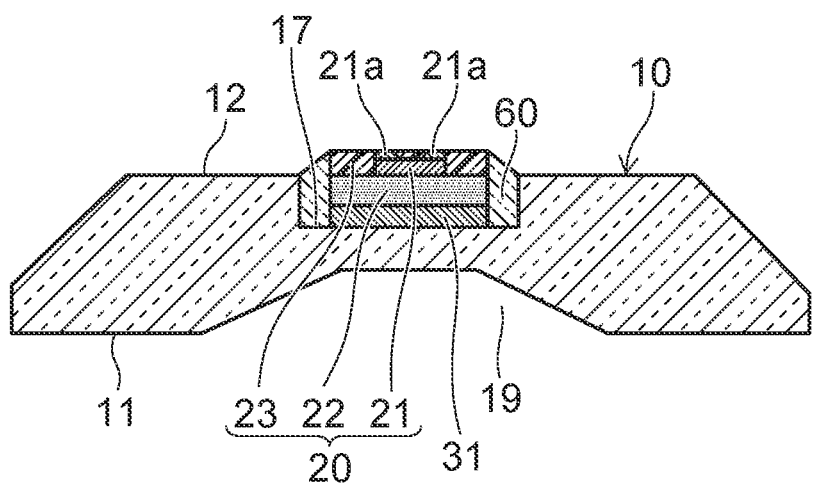
FIG. 6C is a schematic sectional view showing a method of manufacturing a light emitting module according to the embodiment.

FIGS. 6A to 6C are schematic sectional views showing a method of manufacturing the light emitting module 1 according to the embodiment.

As shown in FIG. 6A, a light guide plate 10 is provided. The light guide plate 10 may be formed by, for example, injection molding, transfer molding, thermal transfer, and the like. Forming a recessed portion 19 where an optical function part 32 will be disposed and a recessed portion 15 where a phosphor layer 22 will be disposed all at once using a mold can increase the positioning accuracy between the optical function part 32 and the light emitting element 21.

As shown in FIG. 6B, for the light transmitting part 60, a light transmissive resin, for example, is supplied in the recessed portion 15. The light transmissive resin may be supplied in the recessed portion 15 in a liquid or flowable state by using a method such as potting, printing, spraying, and the like.

After supplying the light transmitting part 50 to the recessed portion 15, as shown in FIG. 6C, a light source 20 together with a light scattering layer 31 is arranged in the recessed portion 15. The light scattering layer 31 may be adhered to the bottom face 17 of the recessed portion 15.

The light scattering layer 31, the phosphor layer 22, and the light emitting element 21 are supplied in the recessed portion 15 as one unit in the state of being bonded with one another. At this point, the phosphor layer 22 which is quadrangular or square-shaped in a plan view is positioned in a self-aligned manner such that the lateral faces 22a are along the long sides 17a of the bottom face 17 of the recessed portion 15. Accordingly, the light emitting element 21 is also positioned relative to the light guide plate 10 in a self-aligned manner. Because the area of the opening 16 of the recessed portion 15 is larger than the area of the bottom face 17, the light scattering layer 31 and the phosphor layer 22 can be easily disposed in the recessed portion 15.

Subsequently, the optical function part 32 shown in FIG. 2 may be provided in the recessed portion 19 on the first primary face 11 side of the light guide plate 10, and a light reflecting resin part 40 may be disposed to cover the oblique faces 14 and the second primary face 12 of the light guide plate 10. A wiring board 50 may be adhered below the light reflecting resin part 40.

In the light emitting module 1 according to the embodiment, because the light emitting element 21 is mounted on the light guide plate 10, but not on the wiring board 50, the distance between the light guide plate 10 and the light emitting element 21 can be reduced. This can reduce the thickness of the light emitting module 1. Such a light emitting module 1 can be used, for example, as a backlight for a liquid crystal display. The distance between the liquid crystal panel and the light emitting module 1 is short in, for example, a direct-lit liquid crystal display in which the backlight is installed on the rear surface of the liquid crystal panel. Therefore, the luminance and color non-uniformities in the light emitting module 1 readily affect the luminance and color non-uniformities of the liquid crystal display. Using such a light emitting module 1 having reduced luminance and color non-uniformities according to the embodiment as the backlight of a direct-lit liquid crystal display can contribute to reduction of the luminance and color non-uniformities of the liquid crystal display.

Figure 7:
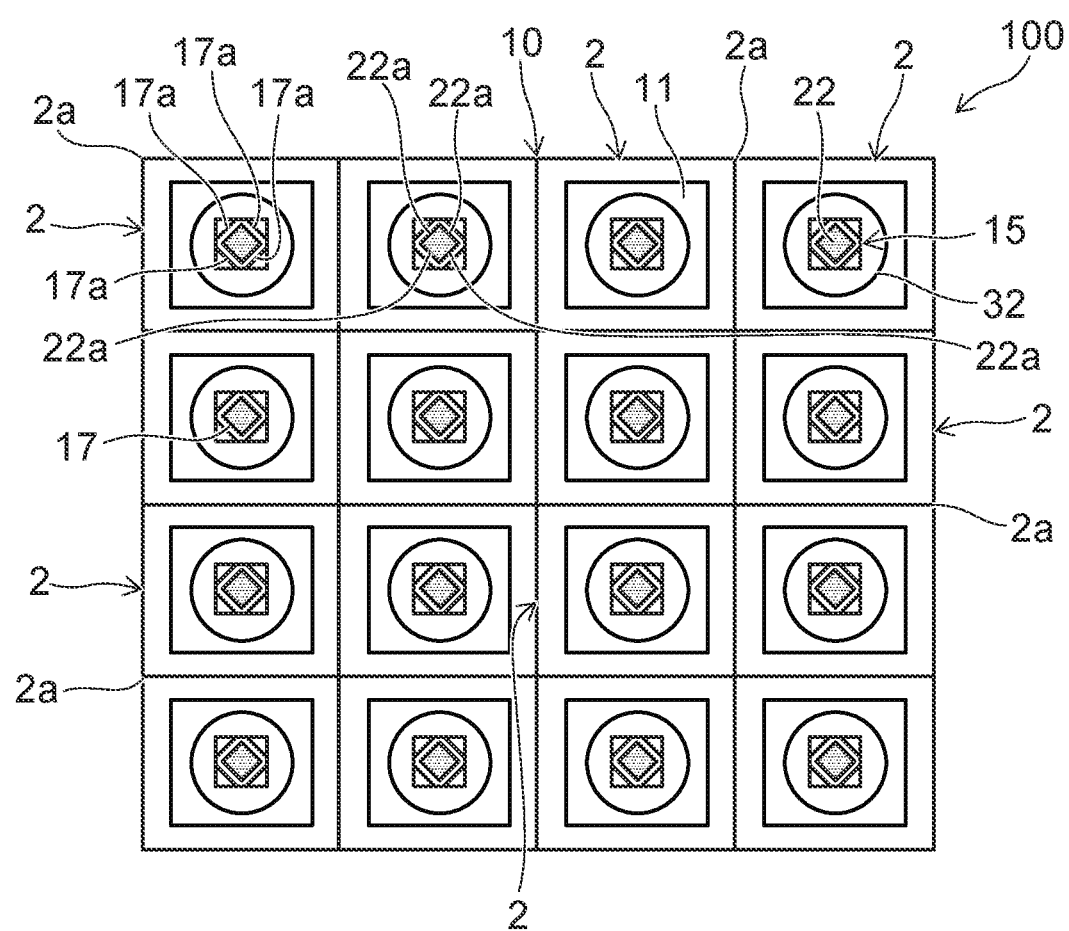
FIG. 7 is a schematic top view of a light emitting module according to another embodiment of the present disclosure.

FIG. 7 is a schematic top view of a light emitting module 100 according to another embodiment of the present disclosure.

The light emitting module 100 has a single light guide plate 10, and a plurality of cells 2 periodically arranged on the light guide plate 10. Each cell 2 has the same structure as that of the light emitting module 1 described above.

In other words, the light guide plate 10 is provided with a plurality of optical function parts 32 on the first primary face 11 side and a plurality of recessed portions 15 on the second primary face 12 side. In each recessed portion 15, a light scattering layer 31, a light source 20, and a light transmitting part 60 are disposed.

FIG. 7 is a plan view of the first primary face 11 of the light guide plate 10. In the plan view, each cell 2 is formed to have a quadrangular or square shape having four corners 2a, for example. Each cell 2 may be arranged such that its sides are along the sides of the first primary face 11 of the light guide plate 10. In a plan view, the long sides 17a of the bottom face 17 of the recessed portion 15 and the lateral faces of the light sources 20 (specifically, the lateral faces 22a of the phosphor layer 22) may respectively face the corners 2a in each cell 2. The diagonal lines connecting opposing corners 2a may intersect with the long sides 17a of the bottom face 17 of the recessed portion 15 in each cell 2. The diagonal lines connecting opposing corners 2a in a cell 2 may intersect with the lateral faces 22a of the phosphor layer 22 in the cell 2.

Accordingly, the light exiting from the phosphor layer 22 in each cell 2 can readily diffuse to the four corners of the cell 2. By inhibiting the luminance from concentrating in the center in each cell 2 across the entire first primary face 11, which is the emission face of the light emitting module 100, the luminance non-uniformity and color non-uniformity in the emission face of the light emitting module 100 can be reduced.

In the foregoing, certain embodiments of the present disclosure have been explained with reference to specific examples. The present disclosure, however, is not limited to these specific examples. All forms implementable by a person skilled in the art by suitably making design changes based on any of the embodiments disclosed above also fall within the scope of the present invention so long as they encompass the subject matter of the present disclosure. Furthermore, various modifications and alterations within the spirit of the present disclosure that could have been made by a person skilled in the art are also considered as those falling within the scope of the present disclosure.

What is claimed is:

1. A light emitting module comprising:
   a light guide plate having a polygonal shape with a plurality of corners in a plan view, the light guide plate having a first primary face which serves as an emission face, a second primary face opposing the first primary face, and a recessed portion in the second primary face,
   a light source disposed in the recessed portion, wherein
   the recessed portion has an opening on the second primary face, and a bottom face having a polygonal shape in a plan view, and a plurality of oblique faces being oblique to the bottom face and forming an obtuse angle with the bottom face,
   the light source has lateral faces along sides of the bottom face of the recessed portion, and
   in a plan view, the oblique faces of the recessed portion are positioned between a plurality of corners of the first primary face and the lateral faces of the light source.

2. The light emitting module according to claim 1, wherein diagonal lines connecting opposing corners of the first primary face intersect with the lateral faces of the light source.

3. The light emitting module according to claim 1, comprising:
   a plurality of cells each having a quadrangular shape and the recessed portion, each including the light source, the cells periodically arranged on the light guide plate,
   in a plan view, in each of the plurality of cells, the sides of the bottom face of the recessed portion and the lateral faces of the light source respectively face corners of the cell.

4. The light emitting module according to claim 1, further comprising a light transmitting part disposed in the recessed portion and surrounding the light source, the light transmitting part in contact with the oblique faces.

5. The light emitting module according to claim 4, wherein the light transmitting part comprises a light transmissive resin part.

6. The light emitting module according to claim 5, wherein a refractive index of the light transmissive resin part is lower than a refractive index of the light guide plate.

7. The light emitting module according to claim 1, wherein an area of the opening of the recessed portion is larger than an area of the bottom face of the recessed portion.

8. The light emitting module according to claim 1, further comprising, an optical function part disposed in the first primary face of the light guide plate in a position to face the recessed portion, and having a lower refractive index than a refractive index of the light guide plate.

9. The light emitting module according to claim 1, wherein the light source includes a light emitting element and a phosphor layer adhered to a primary emission face of the light emitting element.

10. The light emitting module according to claim 1, further comprising a light reflecting material disposed in the first primary face of the light guide plate in a position to face the recessed portion.

11. The light emitting module according to claim 1, wherein in diagonal lines connecting opposing corners of the bottom face having the polygonal shape of the recessed portion, an angle between a lateral face of the recessed portion and the bottom face is smaller than an angle between one of the oblique faces and the bottom face.

12. The light emitting module according to claim 1, wherein in diagonal lines connecting opposing corners of the bottom face having the polygonal shape of the recessed portion, the angle between the lateral face of the recessed portion and the bottom face is 90 degrees.

13. The light emitting module according to claim 3, further comprising a light transmitting part disposed in the recessed portion and surrounding the light source, the light transmitting part in contact with the oblique faces.

14. The light emitting module according to claim 13, wherein the light transmitting part comprises a light transmissive resin part, and a refractive index of the light transmissive resin part is lower than a refractive index of the light guide plate.

15. The light emitting module according to claim 14, wherein in diagonal lines connecting opposing corners of the bottom face having the polygonal shape of the recessed portion, an angle between a lateral face of the recessed portion and the bottom face is smaller than an angle between one of the oblique faces and the bottom face.

16. The light emitting module according to claim 3, wherein in diagonal lines connecting opposing corners of the bottom face having the polygonal shape of the recessed portion, an angle between a lateral face of the recessed portion and the bottom face is smaller than an angle between one of the oblique faces and the bottom face.

17. The light emitting module according to claim 16, wherein an area of the opening of the recessed portion is larger than an area of the bottom face of the recessed portion.

18. The light emitting module according to claim 16, further comprising a light transmitting part disposed in the recessed portion and surrounding the light source, the light transmitting part in contact with the oblique faces.

19. The light emitting module according to claim 18, wherein an area of the opening of the recessed portion is larger than an area of the bottom face of the recessed portion.

20. The light emitting module according to claim 15, wherein an area of the opening of the recessed portion is larger than an area of the bottom face of the recessed portion.

* * * * *